US012713870B2

(12) United States Patent
Nouri

(10) Patent No.: US 12,713,870 B2
(45) Date of Patent: Aug. 18, 2026

(54) SYSTEM AND METHOD OF VERIFYING WORKPIECE ALIGNMENT

(71) Applicant: Axcelis Technologies, Inc., Beverly, MA (US)

(72) Inventor: Yusef Nouri, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 18/969,520

(22) Filed: Dec. 5, 2024

(65) Prior Publication Data

US 2025/0191944 A1 Jun. 12, 2025

Related U.S. Application Data

(60) Provisional application No. 63/607,189, filed on Dec. 7, 2023.

(51) Int. Cl.

*H10P 72/00* (2026.01)
*H01J 37/317* (2006.01)
*H10P 72/50* (2026.01)
*H10P 72/72* (2026.01)

(52) U.S. Cl.

CPC ...... *H10P 72/0606* (2026.01); *H01J 37/3171* (2013.01); *H10P 72/50* (2026.01); *H10P 72/72* (2026.01); *H01J 2237/1825* (2013.01); *H01J 2237/2446* (2013.01)

(58) Field of Classification Search

CPC ......... H01J 37/3171; H01J 2237/30483; H01J 2237/30472; H01J 2237/30455; H01J 2237/30433; H01J 2237/30438; H01J 2237/30; H01J 2237/31701; H01J 2237/31703; H01J 2237/1825; H01J 2237/2446; H01L 21/67259; H01L 21/68;

(Continued)

(56) References Cited

U.S. PATENT DOCUMENTS 4,578,589 A * 3/1986 Aitken ................ H01J 37/3171 250/281
5,134,301 A * 7/1992 Kamata .............. H01J 37/3171 257/E21.334

(Continued)

OTHER PUBLICATIONS

International Search Report and Written Opinion dated Mar. 24, 2025 in connection with Application Serial No. PCT/US2024/059244.

*Primary Examiner* — Wyatt A Stoffa
(74) *Attorney, Agent, or Firm* — Eschweiler & Potashnik, LLC

(57) ABSTRACT

A workpiece processing system and method are disclosed for determining an alignment of a workpiece upon a workpiece support using a retractable sensor. A sensor moves in/out relative to an edge of the workpiece support to obtain positional data while the workpiece support is rotated. Based on the positional data, the alignment of the workpiece and workpiece support may be determined. After determining the alignment, the sensor may be retracted behind the workpiece support, such that the sensor is shielded by the workpiece support from an ion beam during ion implantation. Using a helical motion, an angle between the sensor and a support surface of the workpiece support may be maintained approximately constant during the measurement.

9 Claims, 13 Drawing Sheets

(58) Field of Classification Search
CPC ............... H01L 21/681; H01L 21/6831; H10P 72/0606; H10P 72/72
See application file for complete search history.

(56) References Cited

U.S. PATENT DOCUMENTS 5,389,793 A * 2/1995 Aitken .................... H01J 49/30 250/442.11
6,244,121 B1 * 6/2001 Hunter .................... H10P 72/53 73/866.5
7,453,160 B2 11/2008 Ray
8,071,964 B2 * 12/2011 Satoh .................... H01J 37/244 427/523
8,545,165 B2 * 10/2013 Moura .................... H10P 72/53 414/217
8,735,855 B2 * 5/2014 Ninomiya ............. H01J 37/304 250/492.21
8,835,882 B2 * 9/2014 Lin ....................... H01J 37/244 250/397
8,933,424 B1 * 1/2015 Satoh .................. H01J 37/3171 118/712
10,395,889 B2 * 8/2019 Halling ................. H01J 37/147
11,673,275 B2 * 6/2023 Rogers ..................... B25J 9/042 901/30
12,283,460 B2 * 4/2025 Wills .................. H01J 37/3171
2002/0113218 A1 * 8/2002 Okumura .............. G03F 9/7046 250/548
2002/0134948 A1 * 9/2002 Olson ................... H01J 37/304 250/492.21
2003/0053904 A1 * 3/2003 Kirihata .............. H10P 72/7602 414/941
2005/0231721 A1 * 10/2005 Inenaga ................ G03F 9/7011 257/E23.179
2005/0251279 A1 * 11/2005 Ray ..................... H10P 72/0606 700/114
2009/0242808 A1 * 10/2009 Evans ..................... H10P 30/20 250/492.21
2010/0070077 A1 * 3/2010 Le .......................... B25J 9/1692 700/254
2013/0146760 A1 * 6/2013 Eisner ................... H01J 37/244 250/397
2013/0256566 A1 * 10/2013 Kariya ................ H01J 37/3171 250/492.21
2014/0326179 A1 * 11/2014 Todorov .............. H01J 37/3171 118/697
2016/0189927 A1 * 6/2016 Satoh .................... H01J 37/304 250/492.21
2018/0068829 A1 * 3/2018 Ishibashi ............... H01J 37/304
2020/0246939 A1 8/2020 Kashiwagi et al.
2021/0305011 A1 * 9/2021 Sinclair ................. H01J 37/244
2022/0082942 A1 * 3/2022 Kuwahara ............... G03F 7/422
2023/0140499 A1 * 5/2023 Ishibashi ............. H01J 37/3171 250/492.21
2025/0253120 A1 * 8/2025 Nouri .................. H01J 37/1474

* cited by examiner

SYSTEM AND METHOD OF VERIFYING WORKPIECE ALIGNMENT

REFERENCE TO RELATED APPLICATIONS

This application claims the benefit of U.S. Provisional Application Ser. No. 63/607,189 filed Dec. 7, 2023, entitled, "SYSTEM AND METHOD OF VERIFYING WORKPIECE ALIGNMENT," the contents of which are herein incorporated by reference in their entirety.

FIELD

The present invention relates generally to workpiece handling systems and processes, and more specifically to a system and method for selectively verifying an alignment of a workpiece in an ion implantation system.

BACKGROUND

In semiconductor processing, many operations may be performed on a single workpiece or semiconductor wafer. In many processing operations, a particular orientation of the workpiece and/or knowledge of the position of the workpiece with respect to a workpiece holder is used to properly process or handle the workpiece. For example, operations such as an exchange of workpieces between transport carriers and a processing system may utilize specific orientation (s) or knowledge of the spatial position of the workpiece for proper workpiece handling and processing.

SUMMARY

The present disclosure provides a system, apparatus, and method for determining an alignment of a workpiece with respect to a workpiece support using a retractable sensor. The sensor may be extended from a position behind the workpiece support to a position at least partially above the workpiece support in order to perform measurements. The sensor is moved with respect to an edge of the workpiece support to obtain positional data while the workpiece support is rotated. Based on the positional data, an alignment of the workpiece with respect to the workpiece support is determined. The sensor is configured to be further retracted behind the workpiece support, such that the sensor is generally shielded from a processing medium, such as being shielded from an ion beam by the workpiece and/or the workpiece support during an ion implantation process.

Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

According to one example aspect of the present disclosure, a workpiece characterization system is provided. The workpiece characterization system, for example, comprises a process chamber and a process medium source configured to generate or otherwise define a process medium along a process medium path. A workpiece support having a support surface defining a support plane is further provided, wherein the workpiece support is configured to selectively support a workpiece on the support surface and to selectively expose the workpiece to the process medium along the process medium path within the process chamber. A sensor is further provided, and a coupling apparatus is operably coupled to the sensor.

An actuator is further arranged downstream of the support plane when viewed along the process medium path, wherein the actuator is operably coupled to the coupling apparatus and configured to selectively translate the sensor along a curvilinear sensor path between a first position and a second position via the coupling apparatus. The sensor, for example, is positioned downstream of the support plane in the first position when viewed along the process medium path, and the sensor is positioned at least partially upstream of the support plane in the second position when viewed along the process medium path. Accordingly, when in the second position, the sensor is configured to detect a peripheral edge of the workpiece in the second position.

In accordance with another example aspect, a workpiece characterization system is provided, wherein the workpiece characterization system comprises a process medium source configured to generate or other define a process medium along a process medium path. A workpiece support is provided having a support surface defining a support plane, wherein the workpiece support, for example, comprises an electrostatic chuck and is configured to selectively support a workpiece on the support surface and to selectively expose the workpiece to the process medium. An actuator, for example, is arranged downstream of the support plane when viewed along the process medium path, and a coupling apparatus is operably coupled to the actuator. Further, a sensor is operably coupled to the coupling apparatus and configured to sense a relative position of the workpiece with respect to the workpiece support. The actuator, for example, is configured to selectively translate the sensor between a first position and a second position along a curvilinear sensor path defined by the coupling apparatus, whereby the sensor is positioned downstream of the support plane in the first position when viewed along the process medium path, and whereby the sensor is positioned at least partially above the support surface in the second position.

In accordance with another example, a method is provided for characterizing a position of a workpiece, whereby the workpiece is positioned on a support surface of a workpiece support in a process chamber. The support surface defines a support plane that intersects a process medium path of a process medium. A sensor, for example, is translated along a curvilinear sensor path between a first position and a second position, wherein the sensor is positioned downstream of the support plane in the first position when viewed along the process medium path, and wherein the sensor is positioned at least partially upstream of the support plane in the second position when viewed along the process medium path. A peripheral edge of the workpiece is sensed with the sensor when the sensor is in the second position, and a rotational position of the workpiece support about a support axis is controlled. Further, a relative position of the workpiece on the workpiece support is determined based, at least in part, on the sensing of the peripheral edge of the workpiece and the control of the rotational positional of the workpiece support.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
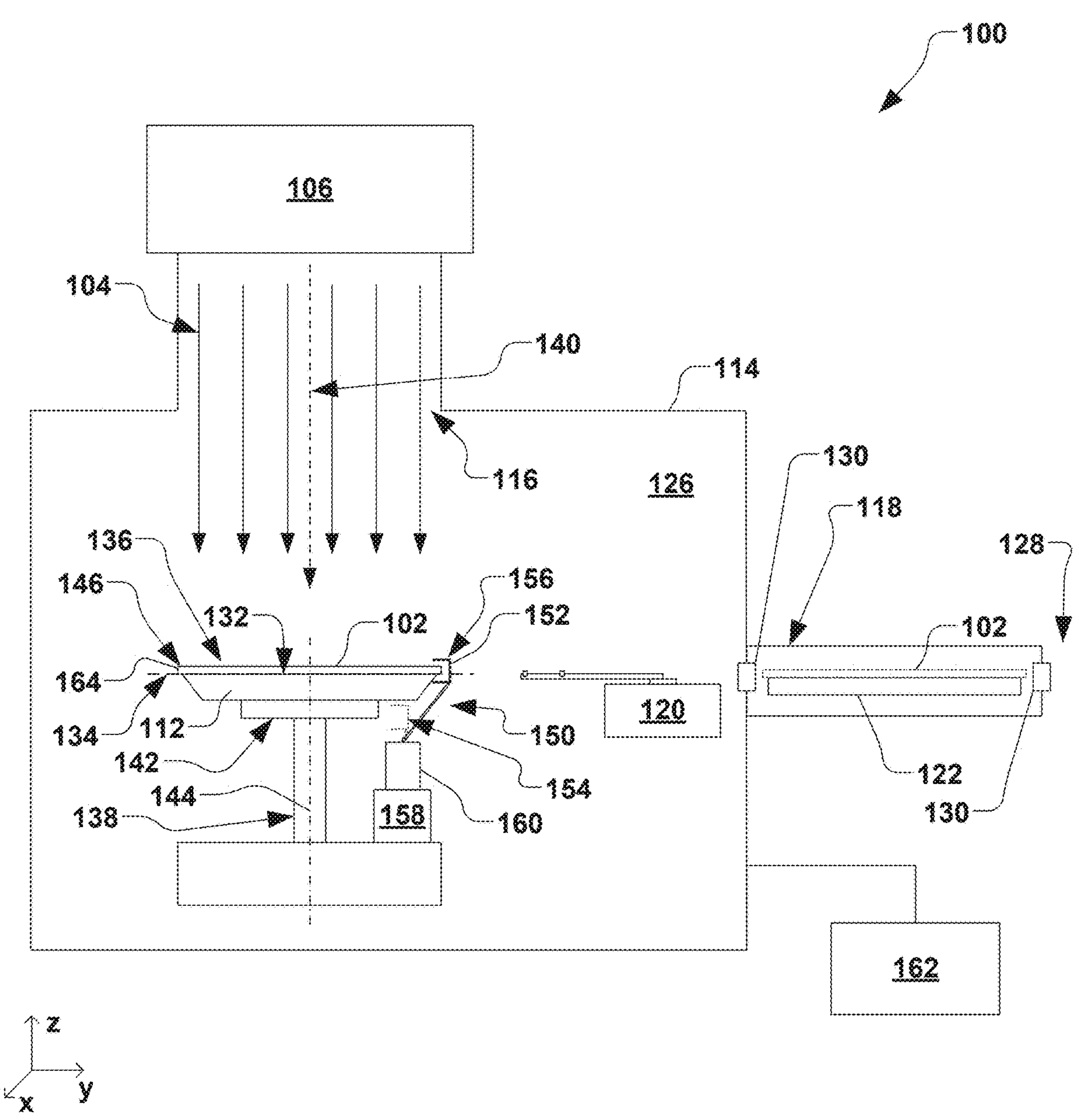
FIG. 1 is a schematic representation of a workpiece processing system configured to determine an alignment of a workpiece on a workpiece support in accordance with some example aspects of the present disclosure.

The present disclosure will now be described with reference to the drawings, wherein like reference numerals may be used to refer to like elements throughout. It is to be understood that the various descriptions of these aspects are illustrative and should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic representations. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment. For example, several functional blocks may be implemented as software running on a common processor or controller.

In various semiconductor processing systems, a workpiece (e.g., a semiconductor wafer) is positioned on a workpiece support (e.g., a chuck) in order to perform various processes on the workpiece. In some examples, heat transfer between the workpiece and the workpiece support plays a significant role in the desired processing of the workpiece. For example, the workpiece support can comprise a heated workpiece support or a chilled workpiece support, whereby the workpiece residing thereon is respectively heated or cooled via heat transfer through a backside gas disposed between the workpiece and workpiece support. For example, the workpiece can be positioned on a chilled workpiece support in an ion implantation system concurrent with an implantation of ions into the workpiece, whereby heat generated at the workpiece from an ion beam is transferred to the cooled workpiece support via the backside gas in order to maintain a predetermined temperature of the workpiece.

In some examples, a projected size or footprint of the workpiece can be greater than that of the workpiece support in order to facilitate placement and removal of the workpiece from the workpiece support, as well as to provide for sealing of the aforementioned backside gas between the workpiece and workpiece support around a periphery of the workpiece. For example, the workpiece can extend past an outermost edge of a workpiece support, whereby a periphery of the workpiece can be selectively engaged or grasped by a workpiece transfer system, while providing the desired sealing of the backside gas to achieve the desired heat transfer.

In order to provide an optimal efficiency of heat transfer between the workpiece and the workpiece support while still allowing for the engagement of the workpiece by the workpiece transfer system, the size ratio of the workpiece support with respect to the workpiece can be optimized to be as close to 1:1 as possible. In some instances, the workpiece support further comprises so-called "lift pins" to raise and lower the workpiece onto the workpiece support, whereby the lift pins allow the footprint of the workpiece support to almost match the size of the workpiece, while still allowing full coverage or protection of a surface of the workpiece support during processing. Accordingly, such a sizing of the workpiece support relative to the workpiece can mitigate contamination issues associated with the ion beam striking the workpiece support.

However, as a size of the workpiece support approaches the size of the workpiece, a misalignment of the workpiece with respect to the workpiece support may result in uneven heat transfer between the workpiece and the workpiece support, thus leading to potential defects across the workpiece. Further, such a misalignment may expose portions of the workpiece support to the ion beam, whereby the workpiece support may be damaged and/or cause contamination within the ion implantation system.

Since an ion implantation system may process thousands of workpieces over its lifetime, maintaining optimal efficiency and minimizing damage and contamination within the system is desirable in order to maximize the lifetime of the system. Furthermore, accurate alignment of the workpiece with respect to the workpiece support is desirable in order to minimize defects on subsequent devices formed on the workpiece that may otherwise be caused by irregular heating of the workpiece across its surface. The present disclosure further appreciates that it is desirable for workpiece alignment verification to be performed in as simple a manner as possible, whereby complex measurement mechanisms and calibrations thereof are minimized or eliminated.

Accordingly, the present disclosure relates to systems and methods for verifying an alignment of a workpiece on a workpiece support. A sensing apparatus is also provided for sensing a position of the workpiece with respect to the workpiece support via a sensor, whereby the sensor is further configured to be selectively shielded from a process medium, such as an ion beam. In accordance with one example aspect of the disclosure, FIG. 1 illustrates a workpiece processing system 100 for selectively processing a workpiece 102 through a process medium 104 generated or otherwise defined by a process medium source 106. The workpiece 102, for example, comprises a semiconductor workpiece, such as a silicon or silicon carbide wafer.

In the present example, the process medium 104 comprises an ion beam, whereby the process medium source 106 comprises an ion implantation system configured to form the ion beam, as will be discussed in further detail infra. It shall be noted that while the process medium source 106 is described as an ion implantation system in various examples herein, the present disclosure is not limited to the specific examples of ion implantation described herein. For example, the present disclosure contemplates the process medium source 106 being configured to provide any of a number of process mediums 104 to the workpiece 102, such as a plasma shower or other process medium, and all such process mediums and process medium sources are contemplated as falling within the scope of the present disclosure.

In accordance with one example aspect of the disclosure, the workpiece support 112 is selectively positioned within a process chamber 114. The process chamber 114, for example, comprises a process medium entrance 116, whereby the process medium entrance is configured to permit the process medium 104 (e.g., the ion beam) to enter the process chamber 114. Accordingly, the workpiece support 112 is configured to selectively expose the workpiece 102 to the process medium 104 within the process chamber 114. In one example, the workpiece support 112 is configured to be selectively translated with respect to the process medium 104, as will be further discussed infra.

A transfer chamber 118 (e.g., a load lock chamber) may be further operably coupled to the process chamber 114, whereby a transfer apparatus 120 (e.g., a robot) is configured to selectively transfer the workpiece 102 between the workpiece support 112 in the process chamber 114 and a transfer chamber support 122 positioned within the transfer chamber 118. The transfer chamber 118, for example, may be configured to selectively isolate a process environment 126 (e.g., a vacuum or controlled pressure environment) within the process chamber 114 from an external environment 128 (e.g., an atmospheric environment) external to the process chamber via one or more transfer chamber passages 130. For example, the transfer chamber 118 is configured to transfer the workpiece 102 between the process environment 126 associated with the process chamber 114 and a front opening unified pod or "FOUP" (not shown) associated with the external environment 128 while maintaining the controlled pressure environment within the process chamber.

The workpiece support 112, for example, comprises a support surface 132 configured to selectively support the workpiece 102 thereon, wherein the support surface generally defines a support plane 134. For example, the support surface 132 generally faces the process medium entrance 116 when the workpiece support 112 is in a processing position 136 within the process chamber 114. As such, when the workpiece support 112 is positioned in the processing position 136 within the process chamber 114, the workpiece support is configured to selectively expose the workpiece 102 to the process medium 104.

The workpiece support 112, for example, is operably coupled to a workpiece positioning apparatus 138, wherein the workpiece positioning apparatus is configured to selectively position the workpiece 102 within the process chamber 114. For example, the workpiece positioning apparatus 138 is configured to selectively rotate and/or translate the workpiece support 112 with respect to a process medium path 140 that is generally defined by the process medium 104. In one example, the workpiece positioning apparatus 138 comprises a robotic apparatus 142 configured to selectively rotate the workpiece support 112 about a workpiece support axis 144. The workpiece positioning apparatus 138, for example, can be further configured to translate the workpiece support 112 along one or more scan axes (e.g., the x-axis and/or y-axis) along the support plane 134.

In order to provide uniformity and consistency of processing of the workpiece 102 through the process medium 104, the present disclosure contemplates a need for a detection of possible inconsistencies in a positioning of the workpiece with respect to the workpiece support 112. For example, when the workpiece 102 is transferred between various positions within the workpiece processing system 100, such as between the transfer chamber 118 and the workpiece support 112 within the process chamber 114, the workpiece may become misaligned, whereby subsequent processing of the workpiece through the process medium 104 can be deleteriously affected by such a misalignment.

The present disclosure, however, appreciates that exposure of sensing equipment to the process medium 104 (e.g., the ion beam) along the process medium path 140 can have a deleterious effect on not only the sensing equipment (e.g., degradation of sensing capabilities due to heating or impingement by the process medium), but also to particle contamination caused by impingement of the process medium on the sensing equipment. For example, the present disclosure appreciates that many semiconductor processing systems can require accurate positioning of the workpiece 102 with respect to the workpiece support 112 for proper processing of the workpiece. In some semiconductor processes, an eccentric or erroneous positioning of the workpiece 102 with respect to the workpiece support 112 can lead to deleterious variations in processing across the workpiece. In an ion implantation process, for example, such erroneous positioning can lead to particle contamination and/or variations in the ion implantation across the workpiece 102, resulting in product failure of semiconductor devices subsequently formed on the workpiece. In other examples, misalignment of the workpiece 102 with respect to the workpiece support 112 can lead to various depositions, implants, contamination, and/or film accumulation from the process medium 104 on the workpiece support 112, which can result in a degradation in material properties of the surface material of the workpiece support. Additionally, sputtering of material from the workpiece support 112 can further lead to particle generation and migration onto the workpiece 102.

Similarly, in instances where the workpiece 102 is thermally cooled or heated by the workpiece support 112 during processing, a variation from a desired position of the workpiece with respect to the workpiece support (e.g., concentric centroids of the workpiece and workpiece support) can lead to deleterious thermal variations across the workpiece. For example, some workpiece handling equipment can demand a peripheral region 146 (e.g., on the order of several millimeters) of the workpiece 102 to be engageable by workpiece handling equipment (e.g., the transfer apparatus 120) in order to selectively engage or support an underside of the workpiece for transferring the workpiece between the workpiece support 112 and another location. Further, in order to protect the support surface 132 of the workpiece support 112 from impingement from the process medium 104, the peripheral region 146 of the workpiece 102 may be left unsupported by the workpiece support 112, whereby a misalignment of the workpiece on the workpiece support can cause a thermal variation in heat transfer therebetween in the peripheral region of the workpiece and/or damage to the support surface that may lead to deleterious contamination within the process chamber 114.

Thus, the present disclosure further provides a workpiece characterization system 150 for characterization of a position of the workpiece 102 with respect to the workpiece support 112 within the process chamber 114, such that accurate positioning and uniform processing of the workpiece through the process medium path 140 can be attained, while minimizing the possibility of contamination or degradation thereof due to its presence within the process chamber. Further, the workpiece characterization system 150 provides for a simple, self-calibrating position control scheme for verifying the position of the workpiece 102 that has not been heretofore disclosed.

In accordance with one example of the present disclosure, the workpiece characterization system 150 comprises a sensor 152 configured to detect a relative position of the workpiece 102 with respect to the workpiece support 112, such as with respect to the workpiece support axis 144. This present disclosure further provides the sensor 152 such that it is selectively movable with respect to the workpiece support 112 between a first position 154 and a second position 156, wherein the first position 154 is downstream of the support plane 134 when viewed along the process medium path 140, and wherein the second position 156 is at least partially above the support surface 132 of the workpiece support. As such, the workpiece characterization system 150 is configured to generally shield or otherwise protect the sensor 152 from deleterious effects of the process medium 104 by positioning the sensor behind, or at least downstream of, one or more of the workpiece 102 and workpiece support 112 in the first position 154, while providing a desired sensing of the workpiece 102 in the second position 156.

In one example, the sensor 152 is selectively moveable with respect to the workpiece support 112 via an actuator 158 that is operably coupled to a coupling apparatus 160. The coupling apparatus 160, for example, is operably coupled to the sensor 152 and configured to interface with the actuator 158, whereby the actuator is configured to selectively translate the sensor between the first position 154 and the second position 156 via the interface with the coupling apparatus, as will be discussed in greater detail infra. Accordingly, the sensor 152, for example, is configured to detect a relative position of the workpiece 102 with respect to the workpiece support 112 (e.g., with respect to the workpiece support axis 144). The sensor 152 is contemplated as comprising one or more of a photoelectric sensor, a light curtain, a laser, or any suitable sensor configured to detect the position of the workpiece 102. In other examples, the present disclosure contemplates the sensor 152 comprising a mechanical contact switch, an ultrasound sensor, a radar sensor, a hall-effect switch, a reed switch, etc., whereby the sensor is configured to detect the relative position of the workpiece 102 with respect to the workpiece support 112.

A controller 162 is further provided in another example, wherein the workpiece characterization system 150 is configured to provide positional data from the sensor 152 to the controller, whereby the positional data can be utilized by the controller to determine whether the workpiece 102 is centered with respect to the workpiece support 112. The positional data may further comprise rotational data associated with a rotational position of the workpiece support 112 about the workpiece support axis 144. The controller 162, for example, is further configured to control one or more of the actuator 158 and the workpiece positioning apparatus 138, whereby the sensor 152 is configured to sense the peripheral region 146 (e.g., a peripheral edge 164) of the workpiece 102 as the workpiece is rotated about the workpiece support axis 144 by the workpiece positioning apparatus.

For example, the controller 162 is configured to control operation of the actuator 158 to translate the sensor 152 between the first position 154 and the second position 156 via the interface with the coupling apparatus 160. The controller 162, for example, may be further configured to rotate the workpiece support 112 about the workpiece support axis 144 concurrent with the translation of the sensor 152 and/or sensing of the peripheral region 146 of the workpiece 102, whereby the position and/or alignment of the workpiece with respect to the workpiece support is determined by the controller based on feedback data from one or more of the sensor, the workpiece positioning apparatus 138, and the actuator 158.

While in the second position 156, for example, the sensor 152 is configured to sense the peripheral edge 164 of the workpiece 102 to determine and/or verify an alignment and/or presence of the workpiece on the workpiece support 112. In another example, the sensor 152 may translated (e.g., via the actuator 158 and coupling apparatus 160) between the second position 156 and an intermediate position (e.g., proximate to the second position) between the first position 154 and the second position, concurrent with the rotation of the workpiece support 112 about the workpiece support axis 144 to determine positions of the workpiece 102 and/or workpiece support at a plurality of locations associated with the peripheral edge 164 of the workpiece. For example, the sensor 152 can be selectively positioned to sense three or more locations about the peripheral edge 164 of the workpiece 102, whereby the alignment of the workpiece with respect to the workpiece support 112 can be determined by the controller 162 based on the feedback from the sensor and the workpiece positioning apparatus 138.

The determination/verification of the alignment of the workpiece 102 may be performed by the controller 162 based on the feedback data, whereby after verifying the alignment of the workpiece 102 upon the workpiece support 112, the actuator 158, for example, is configured to return the sensor to the first position 154, whereby the workpiece processing system 100 may proceed with processing of the workpiece via the process medium 104. As such, the sensor 152 is generally protected from the process medium 104 by one or more of the workpiece 102 and the workpiece support 112, and/or by being positioned downstream of the support plane 134 when viewed along the process medium path 140. For example, in ion implantation processing, when the sensor 152 is retracted behind the workpiece support 112 or workpiece 102, the first position 154 of the sensor can be configured such that the process medium 104 (e.g., the ion beam) does not impinge on the sensor during ion implantation of the workpiece, or such that any impingement of the ion beam on the sensor or coupling apparatus 160, or actuator 158 is downstream of the support plane 134 so as to not carry contamination to the workpiece. Accordingly, damage to the sensor 152 and/or contamination of the workpiece 102 is mitigated during the ion implantation. Further, a uniform implantation can be advantageously achieved based on the verified alignment of the workpiece 102 with respect to the workpiece support 112.

Figure 2:
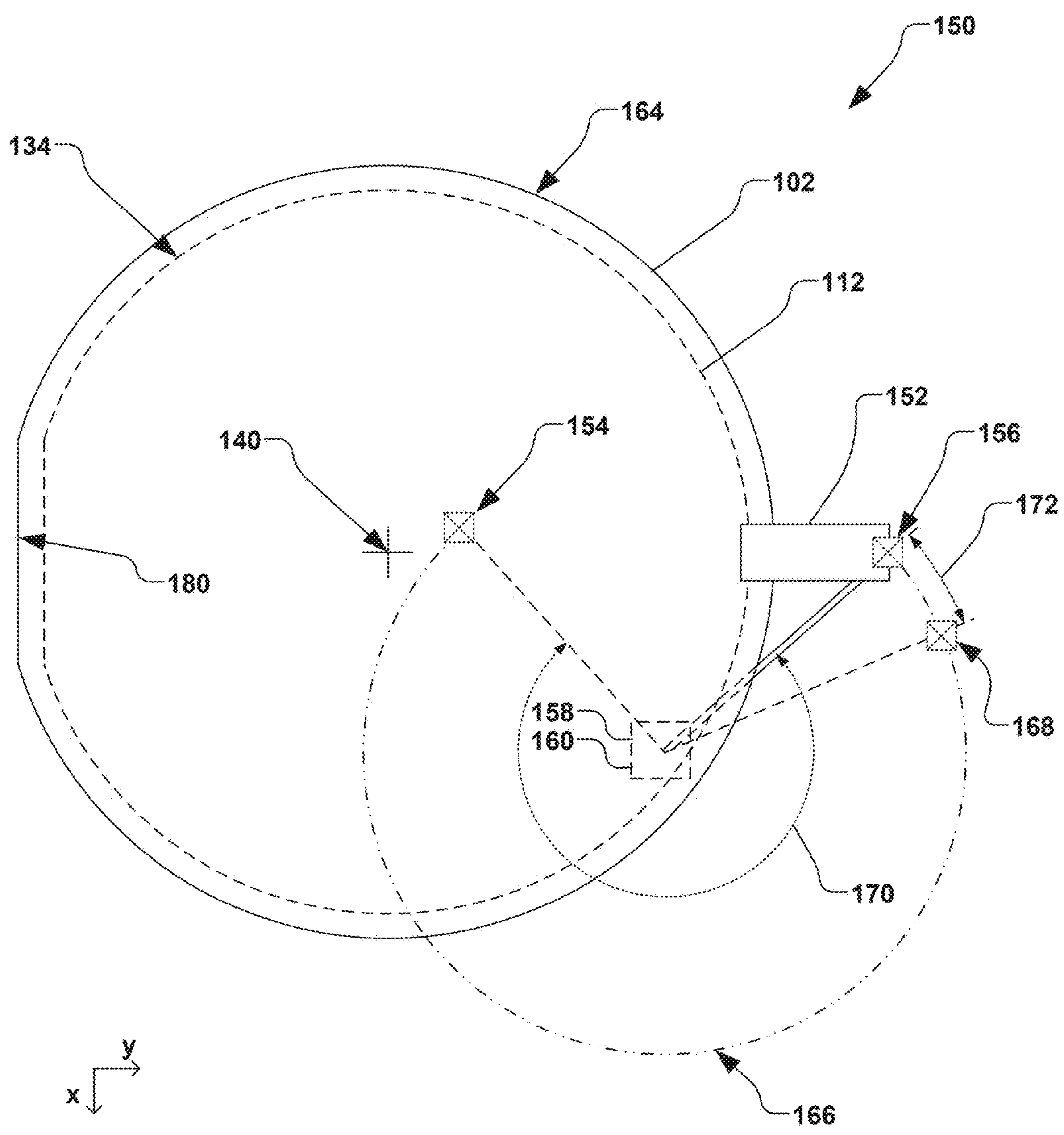
FIG. 2 illustrates a top plan view of a sensor configured to move along a helical path to determine an alignment of a workpiece in accordance with some example aspects of the present disclosure.

FIG. 2 illustrates the workpiece characterization system 150 of FIG. 1 when viewed along the process medium path 140 in accordance with various aspects of the present disclosure. As illustrated in FIG. 2, the sensor 152 is configured to translate along a curvilinear path 166 via actuator 158 and coupling apparatus 160 of FIG. 1 to determine an alignment of the workpiece 102 residing on the workpiece support 112. The sensor 152 shown in FIG. 2, for example, is thus configured to translate between the first position 154 and the second position 156, as described above, whereby the sensor is configured to be positioned below one or more of the workpiece 102 and the workpiece support 112 in the first position, thereby generally shielding the sensor from the process medium (not shown) along the process medium path 140. Further, the sensor 152 is configured to sense the peripheral edge 164 of the workpiece 102 when the sensor is positioned at least partially above the support plane 134, such as in the second position 156.

The present disclosure further contemplates the actuator 158 and coupling apparatus 160 of FIG. 1 being configured to position the sensor 152 at an intermediate position 168 that is proximate to the second position 156. As such, the sensing of the peripheral edge 164 of the workpiece 102 can be achieved at various locations between the intermediate position 168 and second position 156. The present disclosure thus contemplates one example whereby the sensor 152 detects the peripheral edge 164 of the workpiece 102 when it is stationary at the second position 156, as well as other examples whereby the sensor detects the peripheral edge concurrent with the translation of the sensor along the curvilinear path 166 between the first position 154 and second position 156.

For example, a first range of motion 170 (e.g., approximately 270 degrees) is associated with the sensor 152 is defined between the first position 154 and the second position 156. In another example, a second range of motion 172 (e.g., approximately 15 degrees) associated with the sensor 152 can be defined between the intermediate position 168 and second position 156, whereby the sensor 152 can detect of the peripheral edge 164 of the workpiece 102 throughout the second range of motion. For example, the sensor 152 may emit a sensing beam, whereby one or more of the peripheral edge 164 of the workpiece 102 or the workpiece support 112 may intersect the sensing beam during the motion of the sensor along the second range of motion 172, whereby the controller 162 of FIG. 1 can be configured to determine the position of the workpiece with respect to the workpiece support based, at least in part, on feedback from the sensor, actuator 158, and workpiece positioning apparatus 138.

The workpiece support 112, for example, can be rotated about the workpiece support axis 144 by the workpiece positioning apparatus 138, whereby the peripheral edge 164 of the workpiece 102 can be sensed by the sensor 152 concurrent with the rotation of the workpiece support. In one example, the sensor 152 can be positioned at the second position 156 concurrent with the rotation of the workpiece 102, whereby the controller 162 can determine the position of the workpiece with respect to the workpiece support 112 based on the feedback from the sensor and the controlled rotational position of the workpiece support. In another example, as opposed to being stationary at the second position 156, the sensor 152 can be translated along the second range of motion 172 of FIG. 2, whereby the peripheral edge 164 of the workpiece 102 is sensed concurrent with the translation of the sensor along the second range of motion.

Thus, based on the feedback from the actuator 158, workpiece positioning apparatus 138, and sensor 152, the controller 162 of FIG. 1 is configured to determine an alignment of the workpiece 102 with respect to the workpiece support 112. Accordingly, based on the determination of the alignment of the workpiece 102 with respect to the workpiece support 112, for example, appropriate action can be commenced, such as subsequent processing of the workpiece 102 through the process medium 104, re-alignment of the workpiece via the transfer apparatus 120, or aborting of processing of the workpiece.

The present disclosure further appreciates that an alignment feature 180 may be present on the workpiece 102, as illustrated in FIG. 2, whereby the present disclosure further provides for sensing of the alignment feature. For example, the alignment feature 180 may comprise a notch, a flat, or other suitable feature defined at the peripheral edge 164 of the workpiece 102, wherein the controller 162 of FIG. 1 is further configured to determine the relative position of the workpiece 102 with respect to the workpiece support 112 further based on a detection of the alignment feature 180 by the sensor 152.

Referring generally to FIGS. 3A-3H, a workpiece characterization system 200 is illustrated in accordance with various examples of the present disclosure. The workpiece characterization system 200 can be considered a non-limiting example of the workpiece characterization system 150 of FIGS. 1-2, whereby the curvilinear path 166 is generally helical in the examples illustrated in FIGS. 3A-3H. It shall be noted, however, that the examples illustrated in FIGS. 3A-3H are just one set of examples of the workpiece characterization system 150 of FIGS. 1-2, and that various other configurations are contemplated as falling within the scope of the present disclosure.

Figure 3A:
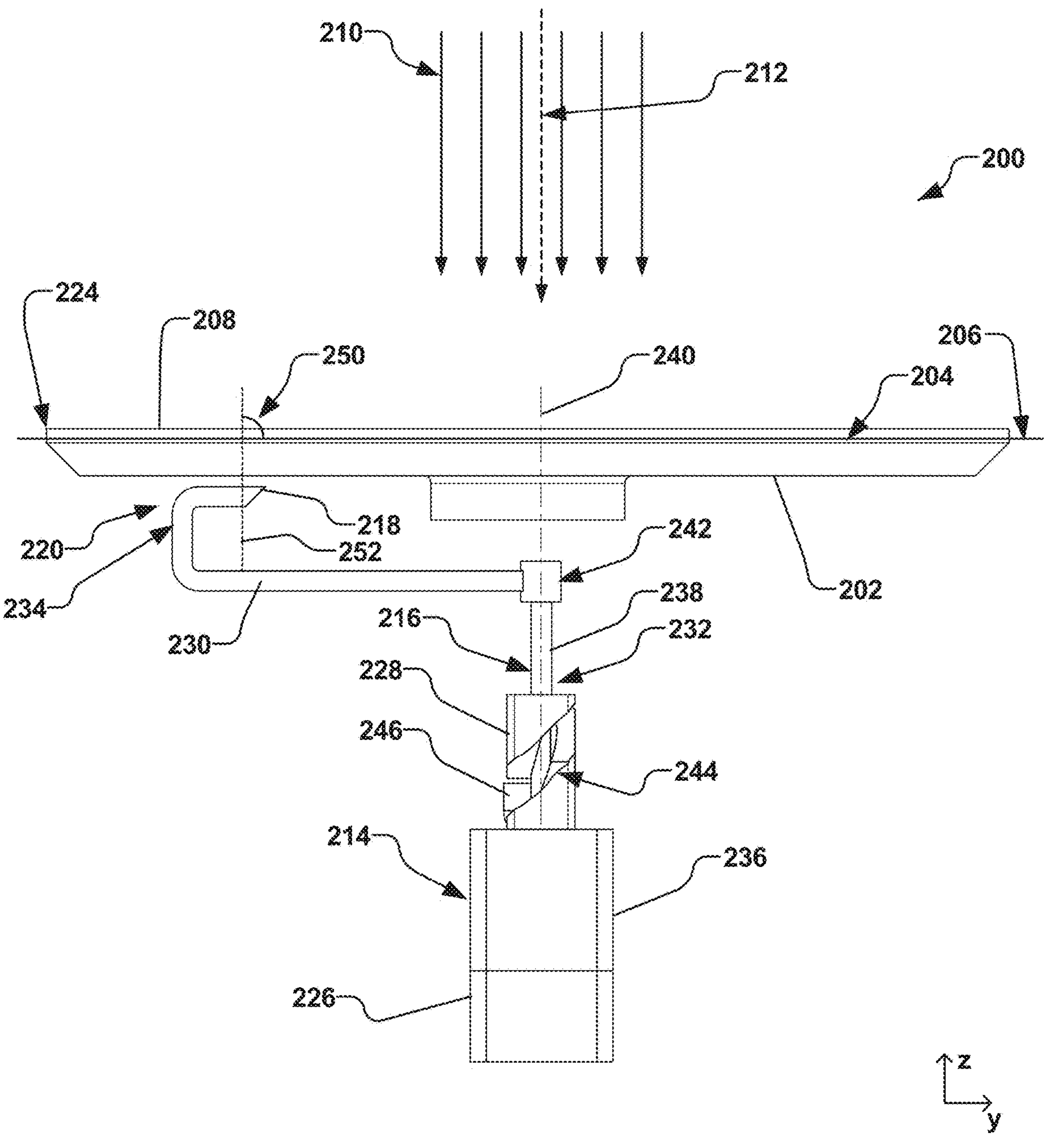
FIGS. 3A-3B illustrate side elevation views of respective first and second positions of a sensor configured to extend along a helical path in accordance with various example aspects of the present disclosure.

Referring now to FIG. 3A, the workpiece characterization system 200 comprises a workpiece support 202 having a support surface 204 defining a support plane 206. The workpiece support 202 is configured to selectively support a workpiece 208 on the support surface 204 and to selectively expose the workpiece 208 to a process medium 210 along a process medium path 212. An actuator 214, for example, is arranged downstream of the support plane 206 when viewed along the process medium path 212. The actuator 214, for example, is operably coupled to a coupling apparatus 216, wherein the coupling apparatus is further operably coupled a sensor 218. The actuator 214, for example, is configured to selectively translate the sensor 218 along the curvilinear path 166 illustrated in FIG. 2. In the present example, the curvilinear path 166 is generally helical, as will be appreciated infra.

Figure 3B:
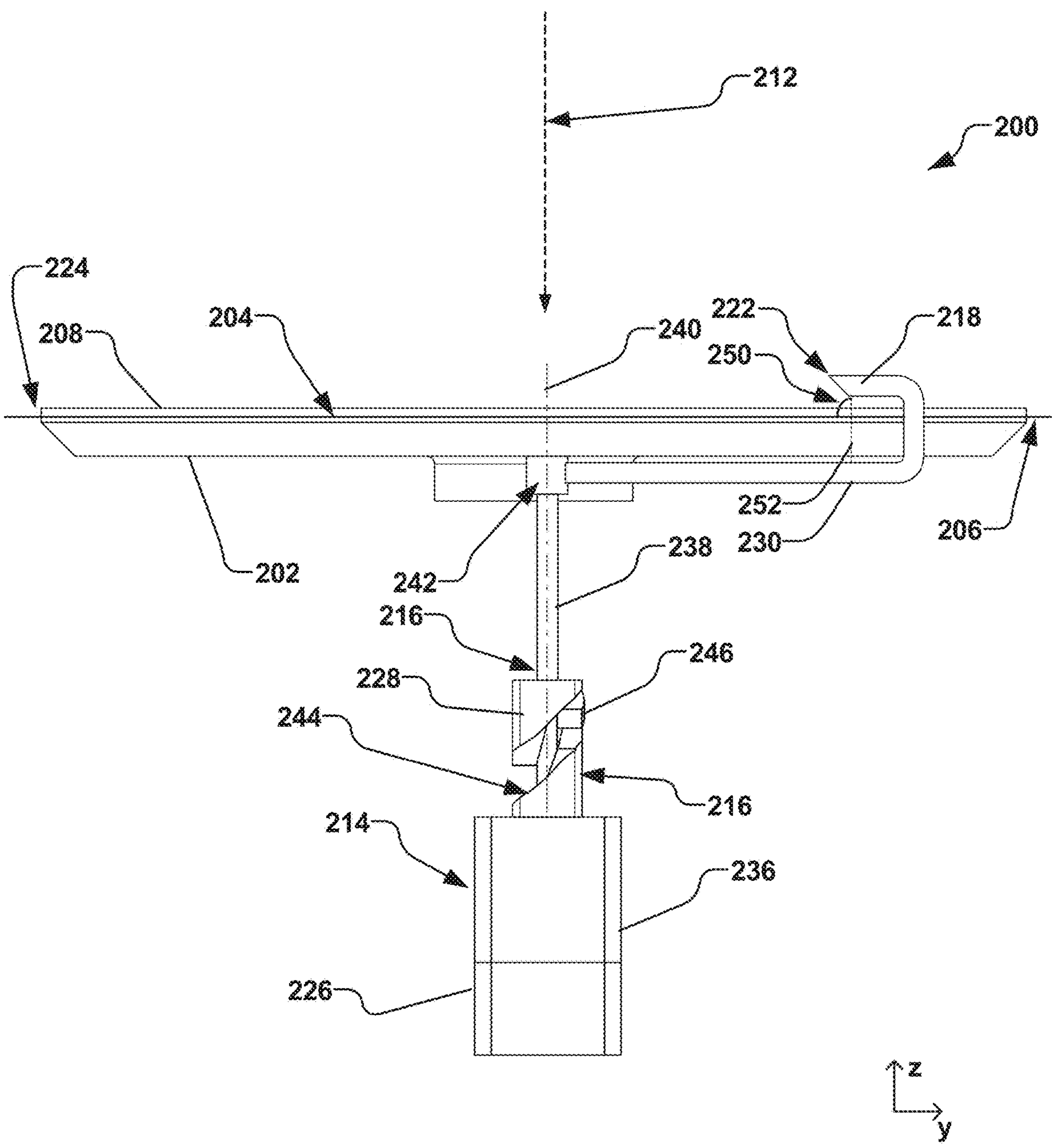
Figure 3C:
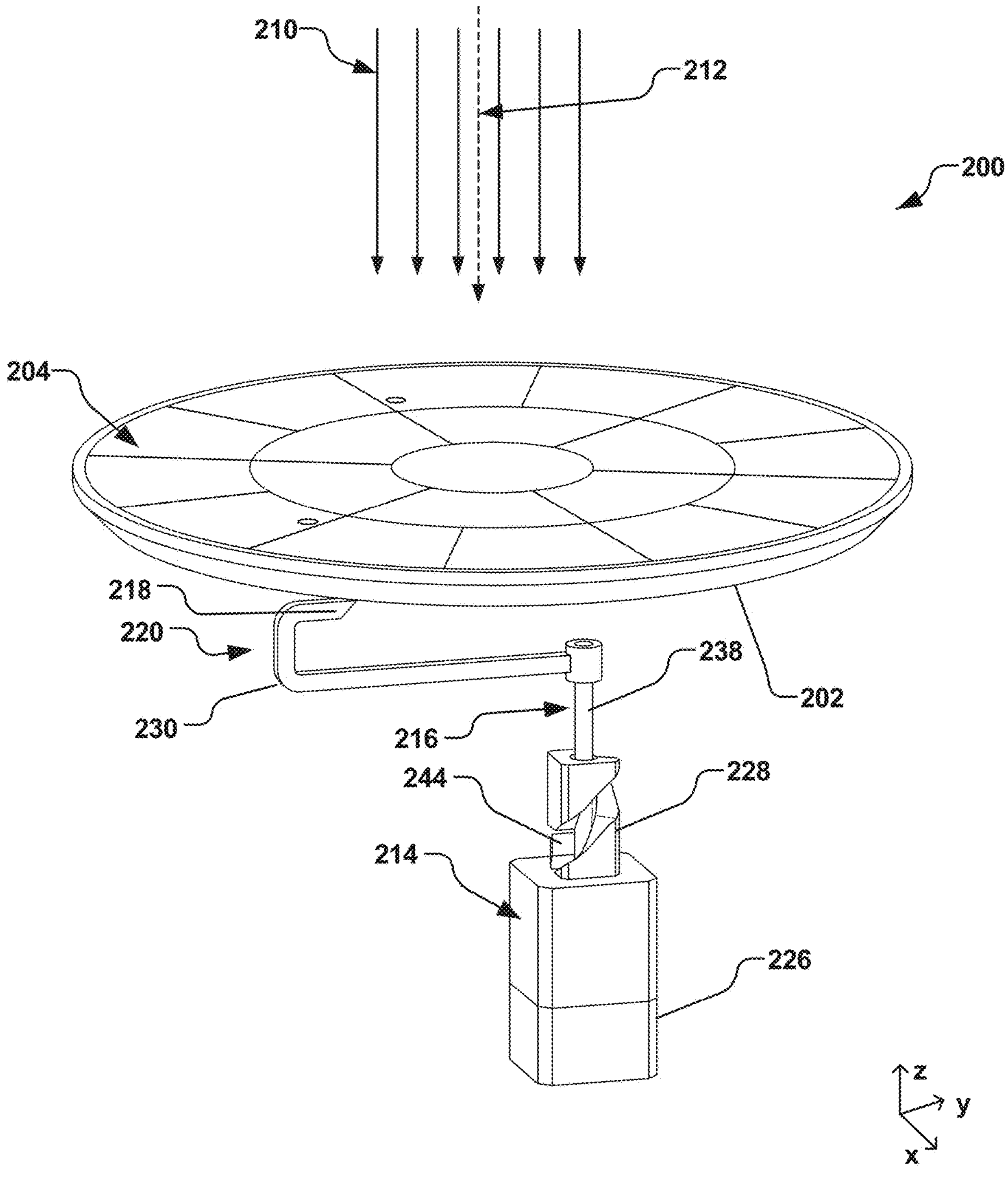
FIGS. 3C-3D illustrate perspective views of the respective first and second positions of the sensor of FIGS. 3A-3B in accordance with various example aspects of the present disclosure.
Figure 3D:
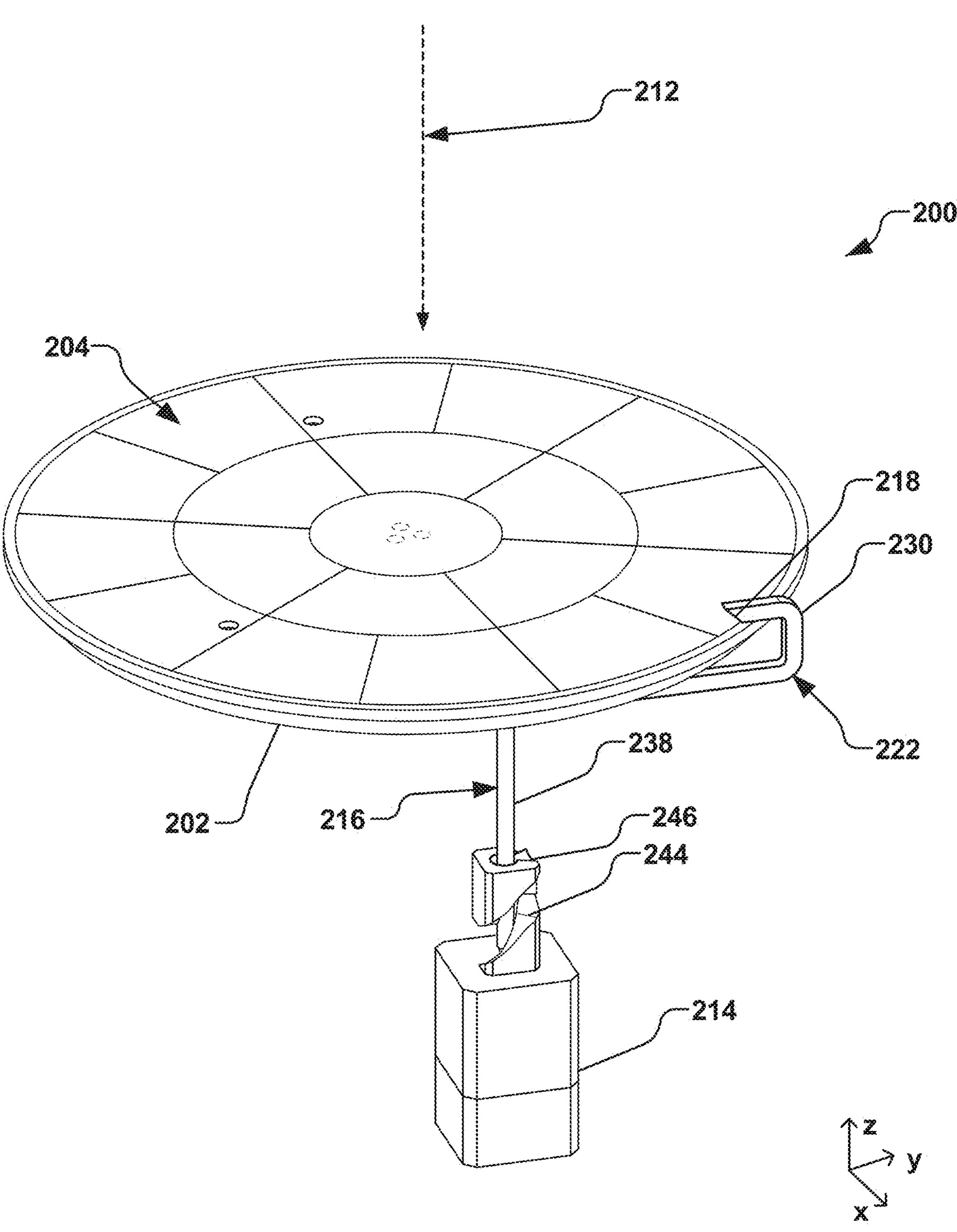
Figure 3E:
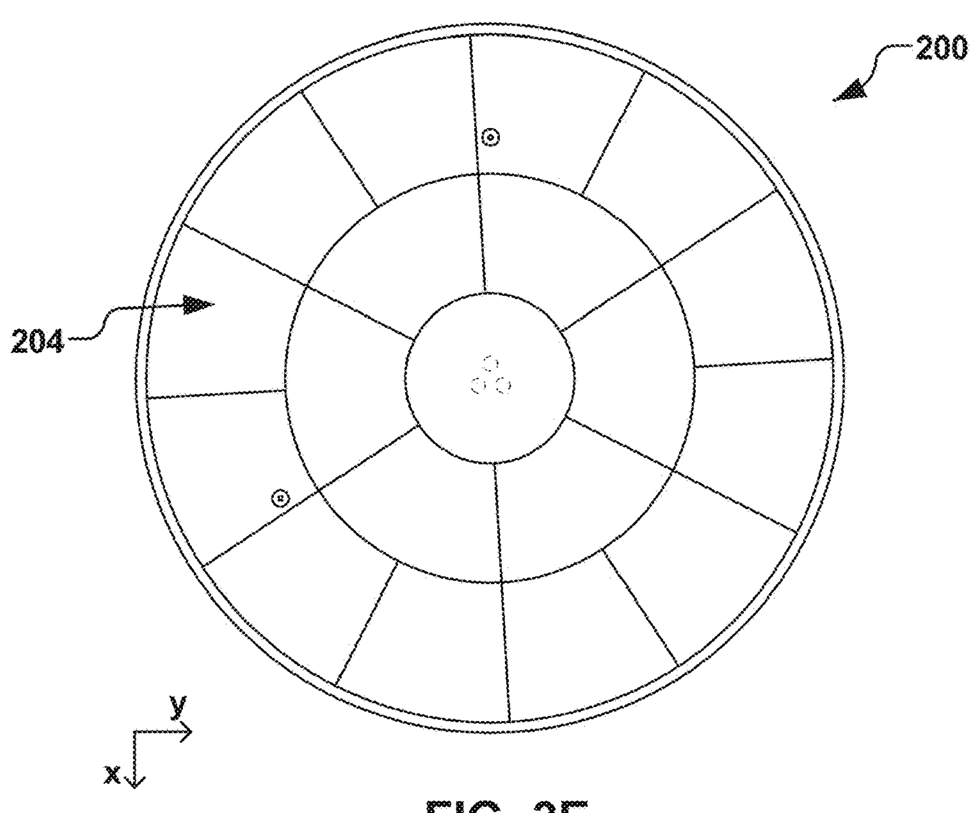
FIGS. 3E-3F illustrate respective top and bottom plan views of the sensor of FIGS. 3A and 3C in the first position in accordance with various example aspects of the present disclosure.
Figure 3F:
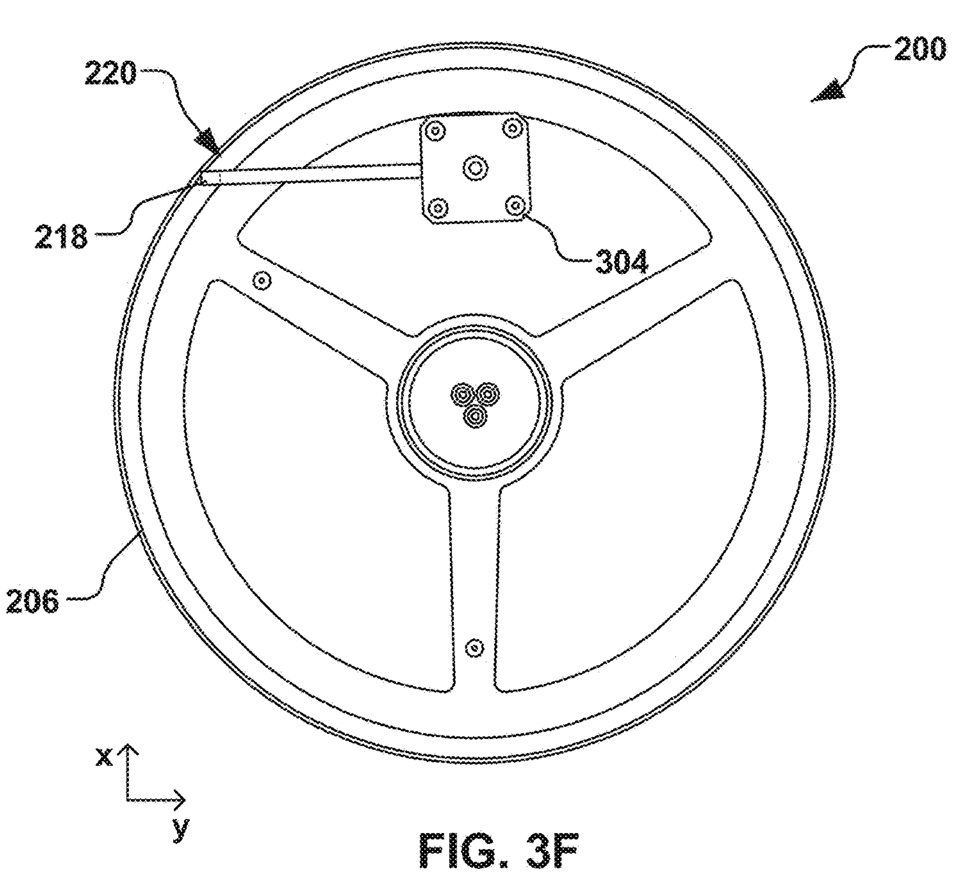
Figure 3G:
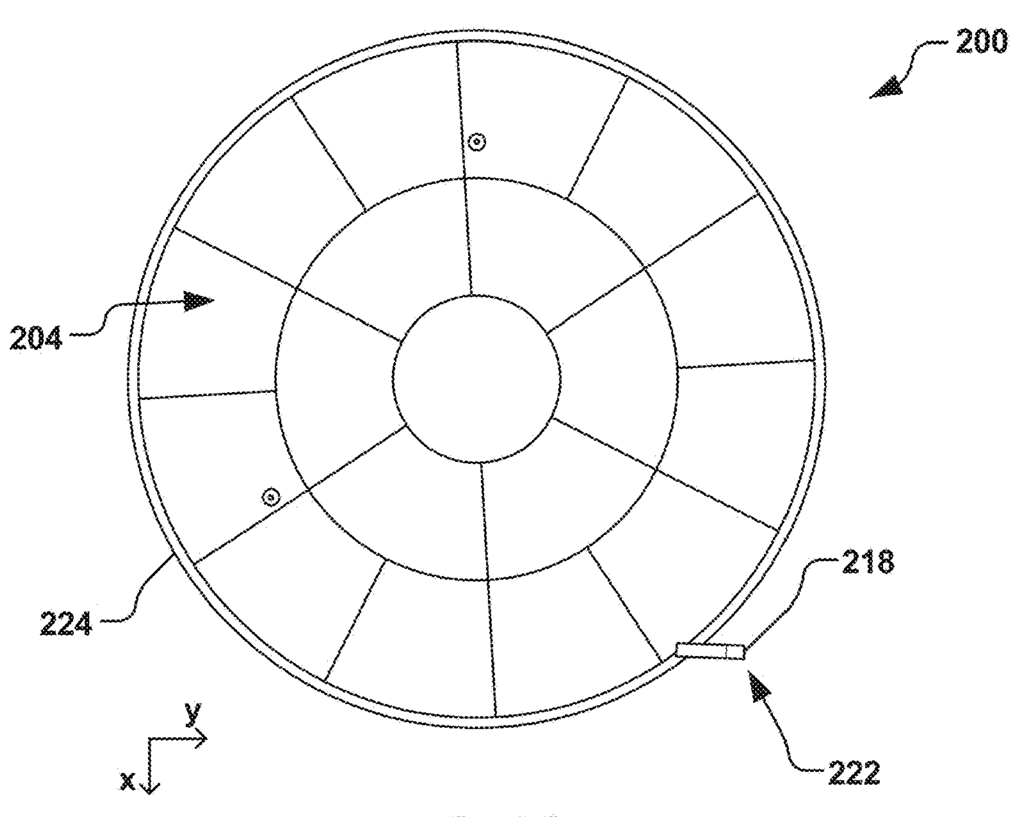
FIGS. 3G-3H illustrate respective top and bottom plan views of the sensor of FIGS. 3B and 3D in the second position in accordance with various example aspects of the present disclosure.
Figure 3H:
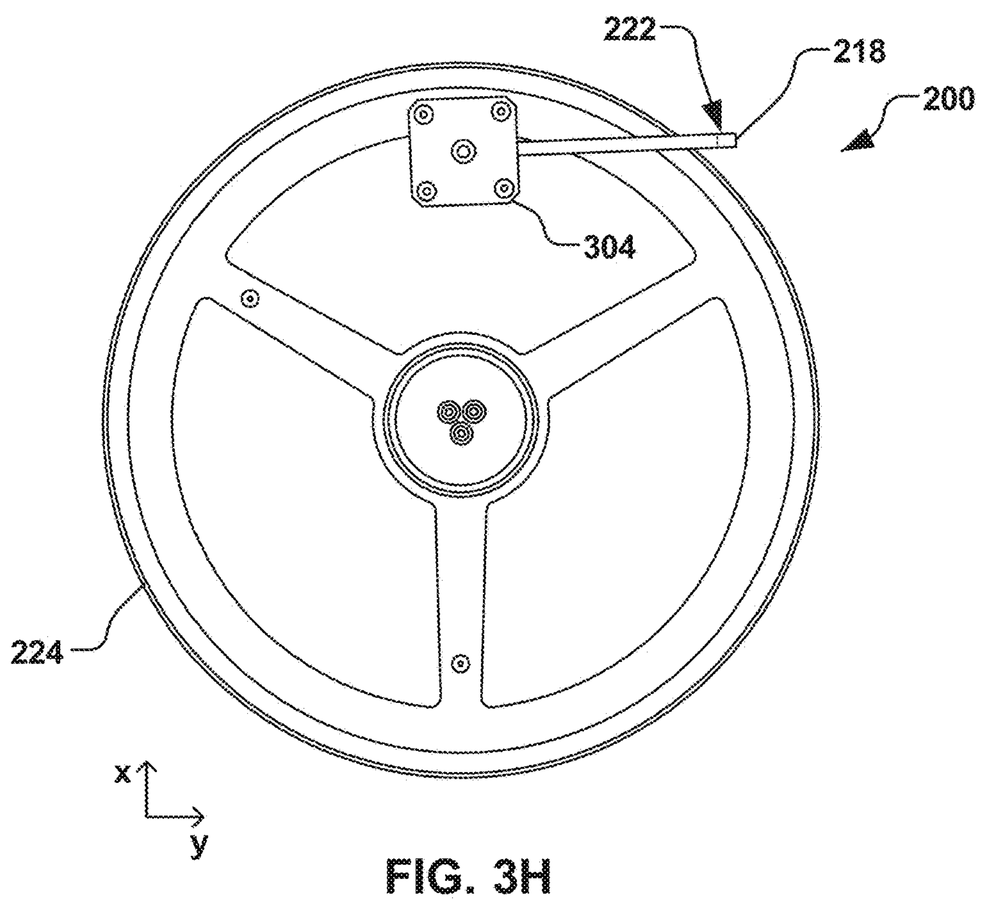

Referring again to FIG. 3A, the actuator 214 is configured to selectively translate the sensor 218 between a first position 220, whereby the sensor is positioned downstream of the support plane 206 when viewed along the process medium path 212, and a second position 222 illustrated in FIG. 3B. Concurrent with being in the second position 222, the sensor 218, for example, is positioned at least partially upstream of the support plane 206 when viewed along the process medium path 212, wherein the sensor is configured to detect a peripheral edge 224 of the workpiece 208. The actuator 214, for example, is configured to selectively translate the sensor 218 between the first position 220 of FIG. 3A and the second position 222 of FIG. 3B via an interfacing with the coupling apparatus 216.

In the present example, the actuator 214, for example, can comprise a linear actuator, rotary actuator. The actuator 214, for example, can further comprise an encoder 226, wherein the encoder is configured to provide positional data associated with the translation of the sensor 218. The positional data, for example, can be sent to the controller 162 of FIG. 1, wherein the controller is configured to determine a relative position of the workpiece 208 of FIGS. 3A-3B with respect to the workpiece support 202 based on the detection of the peripheral edge 224 of the workpiece by the sensor and the positional data from the encoder 226.

According to one example, the coupling apparatus 216 comprises a guide member 228 and sensor arm 230, wherein the actuator 214 is configured to selectively control a motion of the sensor arm 230 with respect to the guide member 228. As such, a motion of the sensor 218 along the curvilinear path 166 of FIG. 2 can be advantageously guided or controlled. The sensor arm 230 of FIGS. 3A-3B, for example, has a first end portion 232 and a second end portion 234, wherein the first end portion is operably coupled to the actuator 214 and the second end portion is operably coupled to the sensor 218.

In the present example, the actuator 214 is fixed with respect to the guide member 228 and comprises a linear actuator 236 configured to linearly translate a drive shaft 238 along a drive axis 240. The drive shaft 238, for example, is fixedly coupled to the sensor arm 230, or is integral to the sensor arm 230. The first end portion 232 of the sensor arm 230, for example, is operably coupled to a distal end 242 of the drive shaft 238. In the present example, the guide member 228 comprises a helical groove 244, and the drive shaft 238 comprises a follower 246, wherein the follower slidingly engages the helical groove to define the translation of the sensor 218 between the first position 220 of FIGS. 3A and 3C and the second position 222 of FIGS. 3B and 3D along the curvilinear path 166 illustrated in FIG. 2 (e.g., a helical sensor path).

In the present example, the actuator 214, coupling apparatus 216, and sensor 218 are generally shielded from the process medium 210 along the process medium path 212 by one or more of the workpiece 208 and the workpiece support 202 when the sensor 218 is in the first position 220, as illustrated in FIGS. 3A, 3C, and 3E-3F. The sensor 218 may be safely positioned in the second position 222 shown in FIGS. 3B, 3D, and 3G-3H when the process medium is not present along the process medium path 212.

The helical motion of the sensor 218 described above advantageously enables the sensor to selectively retract behind the workpiece 208 and/or workpiece support 202, whereby the sensor and optionally, the actuator 214 and coupling apparatus 216 can be positioned downstream of the workpiece support 202 when not actively sensing the workpiece and when processing of the workpiece through the process medium 210 is performed, thereby shielding such components from the process medium that may otherwise lead to deleterious degradation of the components and/or contamination within the system.

The present disclosure further appreciates that during the extension of the drive shaft 238 by the linear actuator 236, for example, drive shaft can be permitted to rotate with respect to the linear actuator, thus permitting the rotational motion of the sensor 218 about the drive axis. As such, the linear motion from the linear actuator 236 drives the rotation of the sensor arm 230. While not shown, the present disclosure contemplates other examples of the actuator 214, such as a rotary actuator, whereby a rotational input translates the guide member along the drive axis. In such an example, a guide rail, linear bearing, or other guide feature may be included to provide the desired translation of the sensor arm 230 from a rotational drive input. The present disclosure appreciates all such inputs to be contemplated and fall within the scope herein.

In some examples, the sensor 218 is not sensitive to, or can compensate for, a change in height relative to the support surface 204 concurrent with sensing due to the helical motion provided herein. Further, as illustrated in FIGS. 3A-3B, in accordance with another example, an angle 250 (e.g., 90 degrees) between a sensing beam 252 associated with the sensor 218 and the support surface 204 of the workpiece support 202 remains substantially constant throughout the range of motion of the sensor from the first position 220 to the second position of respective FIGS. 3A-3B. As such, calculations for determining an alignment of a workpiece 208 upon the workpiece support 202 can be reliably performed.

Figure 4A:
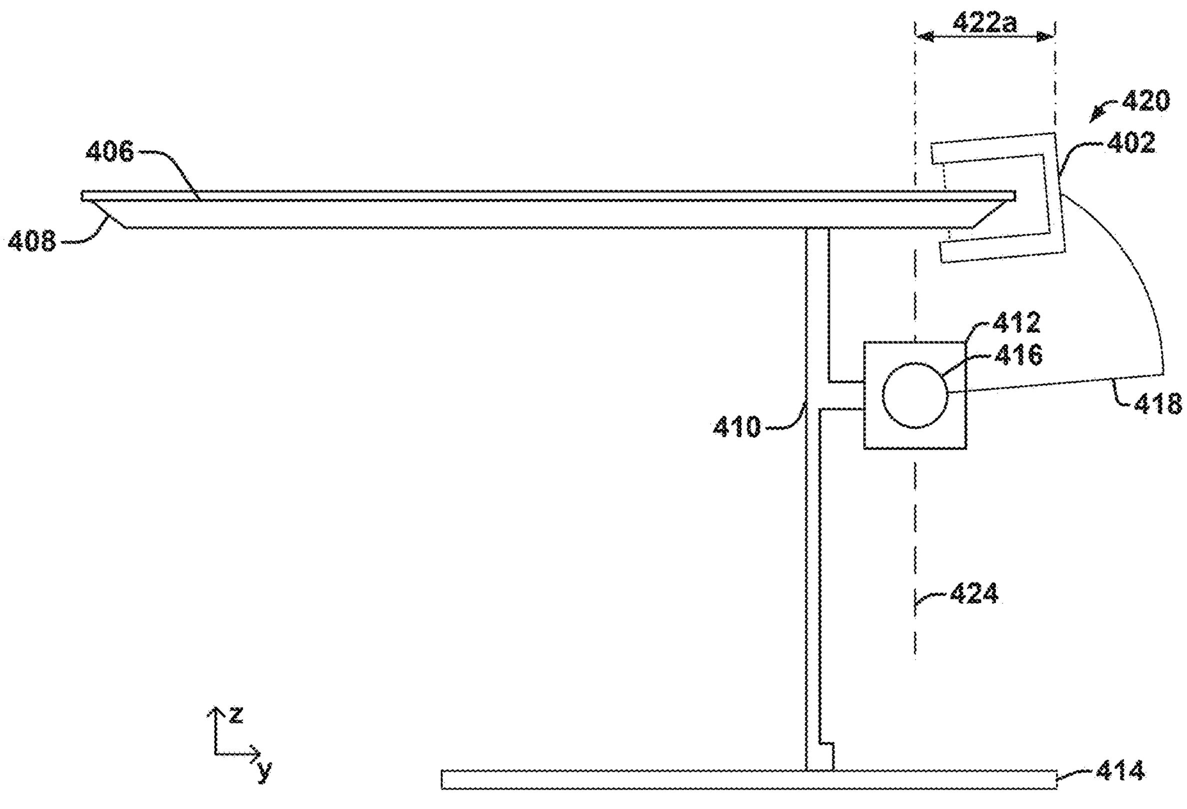
FIGS. 4A-4C illustrate schematic representations of various positions of a sensor configured to rotate about an axis to extend and retract in accordance with some example aspects of the present disclosure.
Figure 4B:
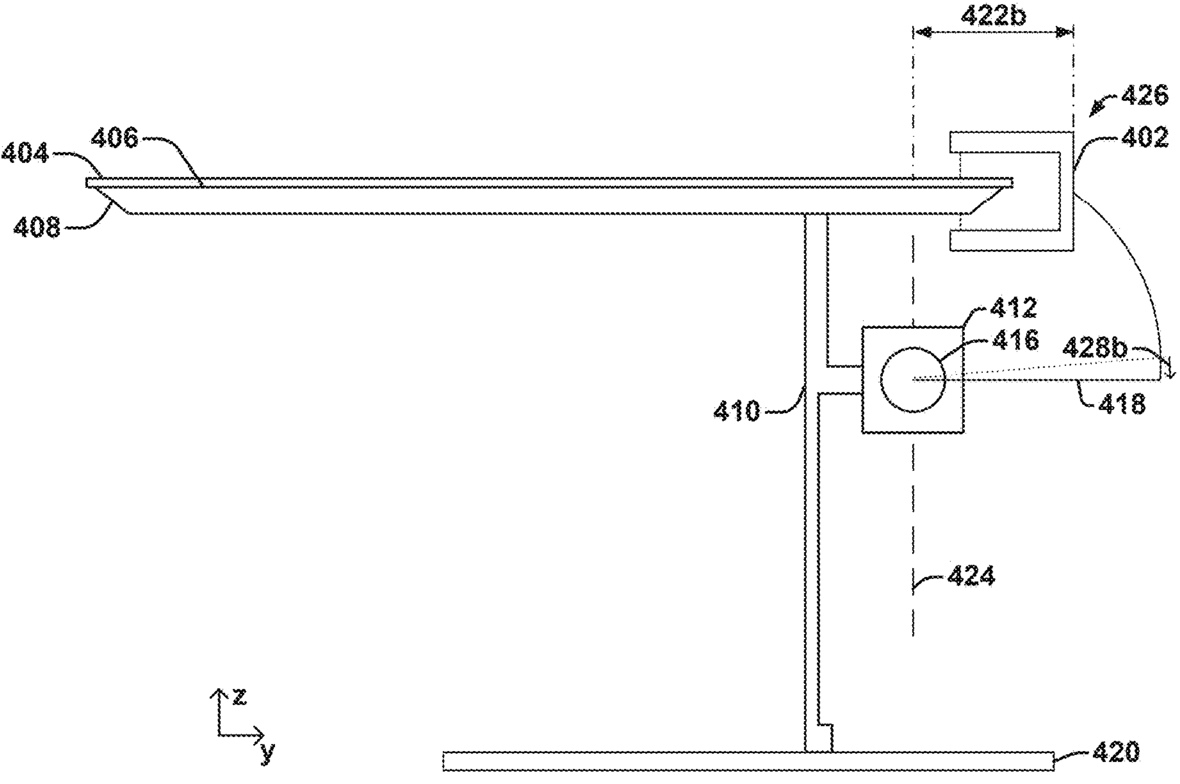
Figure 4C:
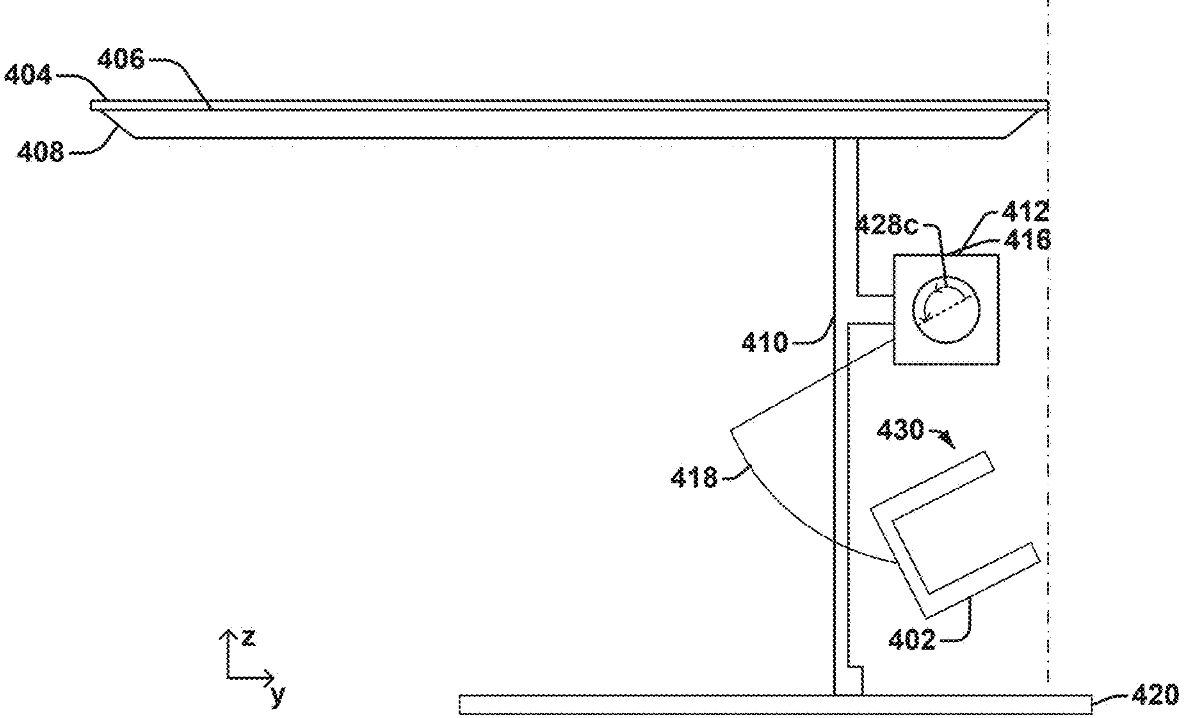

FIGS. 4A-4C illustrate a sensor 402 configured to extend and retract using a hinge motion in accordance with some aspects. A workpiece 404 is supported on a support surface 406 of a workpiece support 408. The workpiece support 408 is coupled to a positioning device 410, which may be controlled by a controller to position the workpiece support 408.

An actuator 412 is coupled to a base structure 414. The base structure is coupled to the positioning device 410, and the base structure 414 is at a fixed position with respect to a center of the workpiece support 408. The actuator 412 further comprises a shaft 416. The actuator 412 is configured to rotate the shaft 416, and the shaft 416 is coupled to a connecting member 418. The rotation of the shaft 416 causes the sensor 402 to move via the connecting member 418. In some aspects, the shaft is rotated about an axis that is parallel to and located below the support surface 406.

As shown in FIG. 4A, the sensor 402 is in a third position 420. While in the third position 420, the sensor 402 is at least partially above the support surface 406 of the workpiece support 408. While in the third position 420, the sensor 402 is a first distance 422*a* from an axis 424 normal to the support surface 406 and intersecting the actuator 412.

As shown in FIG. 4B, the sensor 402 is in a second position 426. While in the second position 426, the sensor 402 is at least partially above the support surface 406 of the workpiece support 408. The actuator 412 rotates the shaft 416 to cause the sensor 402 to, via the connecting member 418, move through a range of motion 428*b* to define a measurement motion. The measurement motion moves the sensor 402 from the third position 420 to the second position 426 or vice versa. During the measurement motion, the sensor 402 senses an edge of the workpiece 404 or the workpiece support 408 to determine an alignment of the workpiece 404 upon the workpiece support 408. As previously described, the measurement motion may be repeated one or more times while the workpiece support 408 is rotated. In the second position 426, the sensor 402 is arranged a second distance 422*b* from the axis 424, which is further than the first distance 422*a*.

As shown in FIG. 4C, the sensor 402 may be retracted completely to a first position 430 below the workpiece support 408. The actuator 412 may rotate the shaft 416 to cause the sensor 402 to, via the connecting member 418, move through a range of motion 428*c* to retract. The sensor 402 may be retracted, for example, in an ion implantation system, after the alignment of the workpiece 404 and the workpiece support 408 has been determined and before ion implantation begins.

Figure 5:
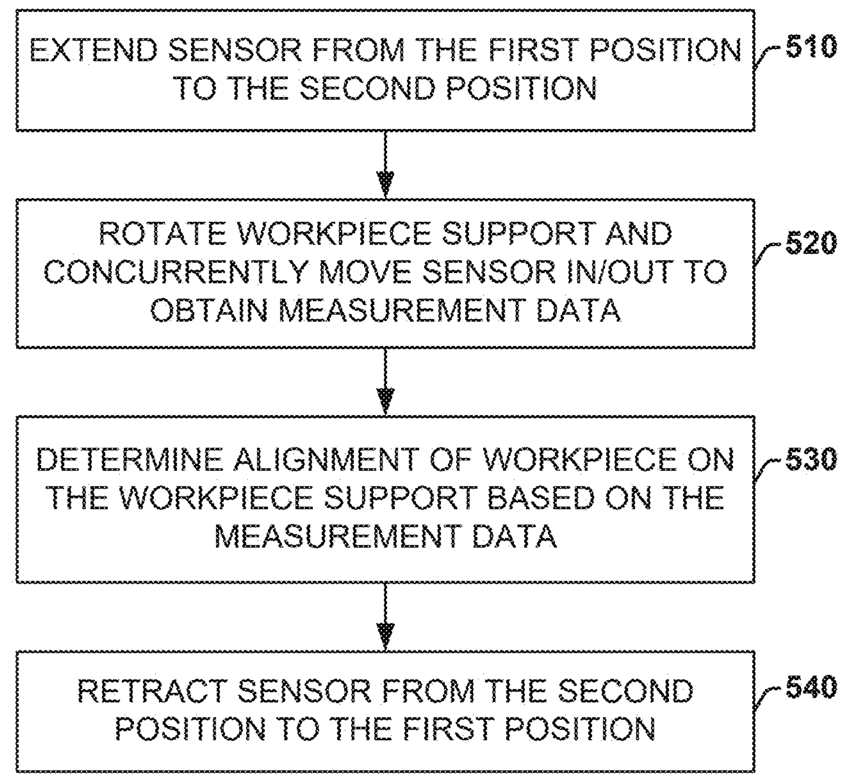
FIG. 5 illustrates an example of a process flow for determining an alignment of a workpiece on a workpiece support.

FIG. 5 illustrates a process flow for determining an alignment of a workpiece on a workpiece support, the workpiece being supported on a support surface of the workpiece support.

In some aspects, at act 510, a sensor is extended from a first position to a second position in order to prepare the sensor to sense an edge of a workpiece or workpiece support. While in the first position, the sensor is below the support surface. While in the second position, the sensor is at least partially above the support surface.

In some aspects, at act 520, the workpiece support is rotated and the sensor is concurrently moved in/out relative to an edge of the workpiece support. During a single rotation of the workpiece support, the sensor may be moved in/out multiple times throughout a measurement motion. During the measurement motion, the sensor detects an edge of the workpiece or the workpiece support to obtain positional data. The sensor may be moved in/out using an actuator and the various structures/connecting members as described throughout the present disclosure.

In some aspects, at act 530, an alignment of the workpiece on the workpiece support is determined. In some aspects, the alignment is determined based on the positional data. In some aspects, at act 540, the sensor is retracted from the second position to the first position. While in the first position, the sensor is shielded from a beam line of a process beam, thereby mitigating damage to the sensor.

Figure 6:
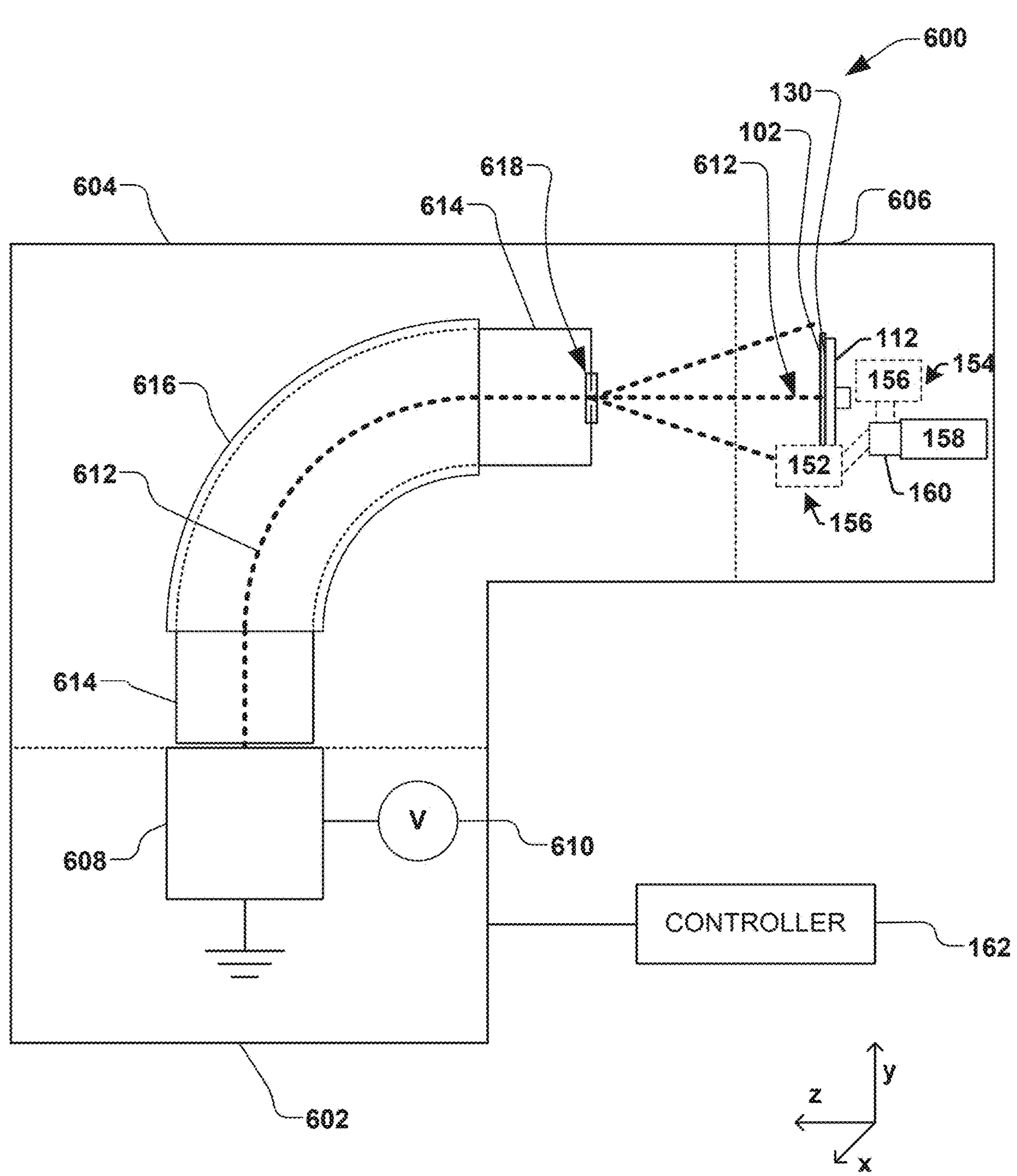
FIG. 6 illustrates an example ion implantation system including a sensor for determining an alignment of a workpiece in accordance with some example aspects of the present disclosure.

FIG. 6 illustrates an ion implantation system 600 in accordance with some example aspects. The ion implantation system 600 is illustrated having a terminal 602, a beamline assembly 604, and an end station 606. The terminal 602, for example, comprises an ion source 608 powered by a high voltage power supply 610. The ion source produces and directs an ion beam 612 through the beamline assembly 604, and ultimately, to the end station 606. The ion beam 612 (e.g., the process medium 104 of FIG. 1), for example, can take the form of a spot beam, pencil beam, ribbon beam, or any other shaped beam. The beamline assembly 604 further has a beam guide 614 and a mass analyzer 616. A dipole magnetic field is established to pass only ions of appropriate charge-to-mass ratio through an aperture 618 at an exit end of the beam guide 614 shown in FIG. 6 to the workpiece 102 (e.g., a semiconductor wafer, display panel, etc.) positioned in the end station 606. The workpiece 102 may be supported on the support surface 132 of the workpiece support 112. Further, the controller 162 is configured to control one or more components of the ion implantation system 600.

The ion implantation system 600 may include the sensor 152 configured to extend from the first position 154 to the second position 156 as described throughout the present disclosure. The sensor 152 may be extended/retracted using the actuator 158 via the coupling apparatus 160. The controller 162 may cause the actuator 158 to move the sensor 152 in/out while simultaneously rotating the workpiece support 112. During the rotation, the sensor 152 detects an edge of the workpiece 102 or the workpiece support 112 to obtain positional data. Finally, the controller determines an alignment of the workpiece 102 upon the workpiece support 112 based on the positional data.

Although the invention has been illustrated and described with respect to one or more implementations, it will be understood that alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including any reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A workpiece characterization system, comprising:

a process chamber;

a process medium source configured to generate a process medium along a process medium path;

a workpiece support having a support surface defining a support plane, wherein the workpiece support is configured to selectively support a workpiece on the support surface and to selectively expose the workpiece to the process medium along the process medium path within the process chamber;

a sensor;

a coupling apparatus operably coupled to the sensor, wherein the coupling apparatus comprises a guide member and a sensor arm; and an actuator arranged downstream of the support plane when viewed along the process medium path, wherein the actuator is operably coupled to the coupling apparatus and configured to selectively translate the sensor along a curvilinear sensor path between a first position and a second position via the coupling apparatus, wherein the sensor is positioned downstream of the support plane in the first position when viewed along the process medium path, and wherein the sensor is positioned at least partially upstream of the support plane in the second position when viewed along the process medium path, wherein the sensor is configured to detect a peripheral edge of the workpiece in the second position, wherein the actuator is configured to selectively control a motion of the sensor arm with respect to the guide member, thereby controlling a motion of the sensor along the curvilinear sensor path, wherein the sensor arm has a first end portion and a second end portion, wherein the first end portion is operably coupled to the actuator and the second end portion is operably coupled to the sensor, and wherein the actuator is fixed with respect to the guide member and comprises a linear actuator configured to linearly translate a drive shaft along a drive axis, wherein the first end portion of the sensor arm is coupled to a distal end of the drive shaft, wherein the guide member comprises a helical groove, and wherein the drive shaft comprises a follower, wherein the follower slidingly engages the helical groove to define the curvilinear sensor path.

2. The workpiece characterization system of claim 1, wherein the actuator, the coupling apparatus, and the sensor are generally shielded by one or more of the workpiece and the workpiece support when the sensor is in the first position.

3. The workpiece characterization system of claim 1, wherein the sensor comprises one or more of a photoelectric sensor, a light curtain, and a laser.

4. The workpiece characterization system of claim 1, further comprising a controller configured to control the actuator and the sensor, wherein the actuator comprises an encoder configured to provide positional data associated with the translation of the sensor along the curvilinear sensor path to the controller, and wherein the controller is configured to determine a relative position of the workpiece with respect to the workpiece support based on the detection of the peripheral edge of the workpiece by the sensor and the positional data from the encoder.

5. The workpiece characterization system of claim 4, wherein the workpiece support further comprises a robot configured to selectively rotate the workpiece support about a support axis, and wherein the controller is further configured to control the robot and to determine the relative position of the workpiece with respect to the workpiece support concurrent with the selective rotation of the workpiece support.

6. The workpiece characterization system of claim 5, wherein the peripheral edge of the workpiece comprises an alignment feature defined therein, and wherein the controller is further configured to determine the relative position of the workpiece with respect to the workpiece support further based on a detection of the alignment feature by the sensor.

7. The workpiece characterization system of claim 5, wherein the controller is configured to determine the relative position of the workpiece with respect to the workpiece support at a plurality of rotational positions of the workpiece support about the support axis.

8. The workpiece characterization system of claim 1, wherein the actuator is further configured to selectively translate the sensor along the curvilinear sensor path to an intermediate position between the first position and the second position.

9. The workpiece characterization system of claim 1, wherein the workpiece support comprises an electrostatic chuck.

* * * * *